(12) United States Patent
Edwards

(10) Patent No.: US 9,902,138 B2
(45) Date of Patent: Feb. 27, 2018

(54) LAMINATED SEALING SHEET

(71) Applicant: CORNING INCORPORATED, Corning, NY (US)

(72) Inventor: Victoria Ann Edwards, Las Cruces, NM (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/897,983

(22) PCT Filed: Jun. 13, 2014

(86) PCT No.: PCT/US2014/042230
§ 371 (c)(1),
(2) Date: Dec. 11, 2015

(87) PCT Pub. No.: WO2014/201315
PCT Pub. Date: Dec. 18, 2014

(65) Prior Publication Data
US 2016/0121583 A1    May 5, 2016

Related U.S. Application Data

(60) Provisional application No. 61/835,120, filed on Jun. 14, 2013.

(51) Int. Cl.
*B32B 3/00*    (2006.01)
*B32B 17/06*    (2006.01)
(Continued)

(52) U.S. Cl.
CPC ............ *B32B 17/06* (2013.01); *B23K 26/206* (2013.01); *B32B 17/064* (2013.01); *C03B 17/02* (2013.01);
(Continued)

(58) Field of Classification Search
CPC ....... B32B 17/00; B32B 17/06; B32B 17/064; C03B 17/02; C03B 17/064; C03B 23/203;
(Continued)

(56) References Cited

U.S. PATENT DOCUMENTS 3,737,294 A    6/1973    Dumbaugh, Jr.
3,746,526 A    7/1973    Giffon
(Continued)

FOREIGN PATENT DOCUMENTS

WO    2013016157 A1    1/2013

OTHER PUBLICATIONS

Younger, Hermetic Glass Sealing by Electrostatic Bonding, Journal of Non-Cystalline Solids 38 and 39, 1980, pp. 909-914.
(Continued)

*Primary Examiner* — Elizabeth E Mulvaney
(74) *Attorney, Agent, or Firm* — Michael A. Hood

(57) ABSTRACT

A glass sealing sheet comprising a glass core layer having a first side and a second side, a first cladding layer bonded to the first side of the glass core layer, and/or a second cladding layer bonded to the second side of the glass core layer. The first cladding layer is comprises a glass composition that is absorbing of radiation over at least a portion of an emission wavelength range.

23 Claims, 4 Drawing Sheets

(51) Int. Cl.

| | |
|---|---|
| *C03C 3/091* | (2006.01) |
| *C03C 8/24* | (2006.01) |
| *C03C 23/00* | (2006.01) |
| *C03B 17/02* | (2006.01) |
| *C03B 17/06* | (2006.01) |
| *C03C 27/06* | (2006.01) |
| *H01L 51/52* | (2006.01) |
| *C03B 23/203* | (2006.01) |
| *B23K 26/20* | (2014.01) |

(52) U.S. Cl.
CPC .......... *C03B 17/064* (2013.01); *C03B 23/203* (2013.01); *C03C 3/091* (2013.01); *C03C 8/24* (2013.01); *C03C 23/0025* (2013.01); *C03C 27/06* (2013.01); *H01L 51/524* (2013.01)

(58) Field of Classification Search
CPC ....... C03B 23/0025; C03C 3/091; C03C 8/24; C03C 23/0025
See application file for complete search history.

(56) References Cited

U.S. PATENT DOCUMENTS

| | | |
|---|---|---|
| 3,849,097 A | 11/1974 | Giffen et al. |
| 3,931,438 A | 1/1976 | Beall et al. |
| 4,102,664 A | 7/1978 | Dumbaugh, Jr. |
| 4,214,886 A | 7/1980 | Shay et al. |
| 5,342,426 A | 8/1994 | Dumbaugh, Jr. |
| 5,559,060 A | 9/1996 | Dumbaugh, Jr. et al. |
| 7,201,965 B2 | 4/2007 | Gulati et al. |
| 7,514,149 B2 | 4/2009 | Bocko et al. |
| 8,007,913 B2 | 8/2011 | Coppola et al. |
| 8,148,179 B2 | 4/2012 | Aitken et al. |
| 2004/0197575 A1 | 10/2004 | Bocko et al. |
| 2005/0116245 A1 | 6/2005 | Aitken et al. |
| 2006/0127679 A1 | 6/2006 | Gulati et al. |
| 2010/0186449 A1 | 7/2010 | Aitken et al. |
| 2011/0001424 A1 | 1/2011 | Logunov et al. |
| 2011/0223360 A1 | 9/2011 | Shibuya et al. |
| 2011/0256334 A1 | 10/2011 | Edwards et al. |
| 2014/0238078 A1* | 8/2014 | Boek ...................... C03C 15/00 65/30.14 |
| 2015/0251383 A1* | 9/2015 | Beall ...................... C03B 17/02 428/428 |
| 2015/0251949 A1* | 9/2015 | Boek ...................... B32B 17/06 428/428 |
| 2015/0291468 A1* | 10/2015 | Boek ...................... C03B 17/02 428/410 |
| 2016/0114564 A1* | 4/2016 | Dejneka .................. C03C 3/062 428/217 |

OTHER PUBLICATIONS

International Search Report and Written Opinion, dated Sep. 22, 2014, pp. 1-10, International Patent Application No. PCT/US2014/042230, European Patent Office, Munich, Germany.

* cited by examiner

LAMINATED SEALING SHEET

This application claims the benefit of priority under 35 U.S.C. § 371 of International Application No. PCT/US2014/042230, filed on Jun. 13, 2014, which claims the benefit of priority under 35 U.S.C. § 119 of U.S. Provisional Application Ser. No. 61/835,120, filed on Jun. 14, 2013, the content of each of which is relied upon and incorporated herein by reference in its entirety.

BACKGROUND

Field

The present specification generally relates to laminated sealing sheets and more specifically to a laminated sealing sheets used in glass-to-glass sealing to form hermetically sealed glass packages.

Technical Background

Hermetic glass-to-glass seals may be used in many industries, such as, display technologies, semiconductor technologies, lighting technologies, and photovoltaic technologies. Historically, some hermetic glass-to-glass sealing processes utilized elevated temperatures during the sealing process, which can lead to damage of the resultant sealed product. For example, in sealing organic light emitting devices/diodes (OLEDs), sealing processes that transfer excessive heat to the active organic layer can damage the active organic layer. In addition, OLEDs can be susceptible to environmental degradation from exposure to water vapor, oxygen, or both, which can be deleterious to the organic material and the electrical components of the OLED structure.

To minimize excessive heat transfer and environmental contaminations, laser-fit sealing, laser direct-glass sealing, and thin-film low-melting glass sealing have been employed. Laser frit sealing can add the cost of having to pattern the frit line before applying the laser or of having to apply a layer of frit to the sheet. Direct-glass-sealing can suffer from the disadvantages of poor optical transmission through the sealing sheet and the high cost of making exotic (expensive) laser-absorbing glass. The thin-film low-melting glass sealing involves a thin film sealing layer that is typically from about 0.5 to about 2.0 microns in thickness being applied to an exterior glass carrier surface. Therefore, the thin film material is not fusion formable and is supplied by sputter coating onto the glass carrier, which can add cost to sputter coat the material onto glass, especially since sputtering is an inherently slow process and large vacuum equipment may be required. In addition, the thin film sealing can be subject to damage, such as scratching or delamination. Glass-to-glass sealing may also be done with polymeric or filled polymeric materials, but these seals may not provide the degree of hermeticity needed for certain applications. Glass seals can also be created by anodic bonding, but this can require high voltages, which would not be suitable for applications having electronic circuits already patterned on the glass.

Alternative approaches for glass-to-glass sealing are disclosed herein.

SUMMARY

In embodiments, a glass sealing sheet is disclosed. The glass sealing sheet comprises a glass core layer having a first side and a second side, a first cladding layer bonded to the first side of the glass core layer, and/or a second cladding layer bonded to the second side of the glass core layer, wherein the first cladding layer has a first coefficient of thermal expansion and comprises a glass composition that is absorbing of radiation over at least a portion of an emission wavelength range. In embodiments, the second cladding layer comprises a composition that is different from the glass composition of the first cladding layer and has a second coefficient of thermal expansion, and a differential between the first coefficient of thermal expansion and the second coefficient of thermal expansion ranges from about $0 \times 10^{-7}/°$ C. to about $10 \times 10^{-7}/°$ C.

In embodiments, a glass package is disclosed. The glass package comprises a glass sealing sheet, and a glass substrate sealed to the glass sealing sheet. In embodiments, the glass sealing sheet may comprise a glass core layer having a first side and a second side, a first cladding layer bonded to the first side of the glass core layer, and/or a second cladding layer bonded to the second side of the glass core layer, wherein the first cladding layer has a first coefficient of thermal expansion and comprises a glass composition that is absorbing of radiation over at least a portion of an emission wavelength range. In embodiments, the second cladding layer comprises a composition that is different from the glass composition of the first cladding layer and has a second coefficient of thermal expansion, and a differential between the first coefficient of thermal expansion and the second coefficient of thermal expansion ranges from about $0 \times 10^{-7}/°$ C. to about $10 \times 10^{-7}/°$ C.

In embodiments, a method of manufacturing a glass sealing sheet is disclosed. The method comprises melting a core glass composition to form a molten core glass composition, melting a first cladding glass composition comprising radiation absorbing constituents to form a molten first cladding glass composition, melting a second cladding glass composition to form a molten second cladding glass composition, flowing the molten core glass composition, the molten first cladding glass composition, and the molten second cladding glass composition such that they converge and form a composite flow, and drawing the composite flow into a glass sealing sheet comprising a glass core layer having a first side and a second side, a first cladding layer having a first coefficient of thermal expansion bonded to the first side of the glass core layer, and a second cladding layer having a second coefficient of thermal expansion bonded to the second side of the glass core layer, wherein a differential between the first coefficient of thermal expansion and the second coefficient of thermal expansion ranges from about $0 \times 10^{-7}/°$ C. to about $10 \times 10^{-7}/°$ C.

In embodiments, a method of manufacturing a glass package is disclosed. The method comprises placing a glass sealing sheet in contact with a glass substrate, the glass sealing sheet comprising a glass core layer having a first side and a second side, a first cladding layer bonded to the first side of the glass core layer, and/or a second cladding layer bonded to the second side of the glass core layer, wherein the first cladding layer has a first coefficient of thermal expansion and comprises a glass composition that is absorbing of radiation over at least a portion of an emission wavelength range. In embodiments, the second cladding layer has a second coefficient of thermal expansion and is formed from a composition that is different from the glass composition of the first cladding layer, and a differential between the first coefficient of thermal expansion and the second coefficient of thermal expansion ranges from about $0 \times 10^{-7}/°$ C. to about $10 \times 10^{-7}/°$ C. In embodiments, the method comprises irradiating a predetermined sealing area along the first cladding layer with a laser to form a sealed glass package.

In embodiments, a method of manufacturing a glass sealing sheet is disclosed. The method comprises melting a core glass composition to form a molten core glass composition, melting a first cladding glass composition comprising radiation absorbing constituents to form a molten first cladding glass composition, melting a second cladding polymer composition to form a molten second cladding polymer composition, flowing the molten core glass composition, the molten first cladding glass composition, and the molten second cladding polymer composition such that they converge and form a composite flow, and drawing the composite flow into a glass sealing sheet comprising a glass core layer having a first side and a second side, the glass core layer having a core coefficient of thermal expansion, a first cladding layer having a first coefficient of thermal expansion bonded to the first side of the glass core layer, and a second cladding layer bonded to the second side of the glass core layer, wherein a differential between the first coefficient of thermal expansion and the core coefficient of thermal expansion ranges from about $0 \times 10-7/°$ C. to about $10 \times 10-7/°$ C.

Additional features and advantages of the embodiments will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

In embodiments.

DETAILED DESCRIPTION

Figure 1:
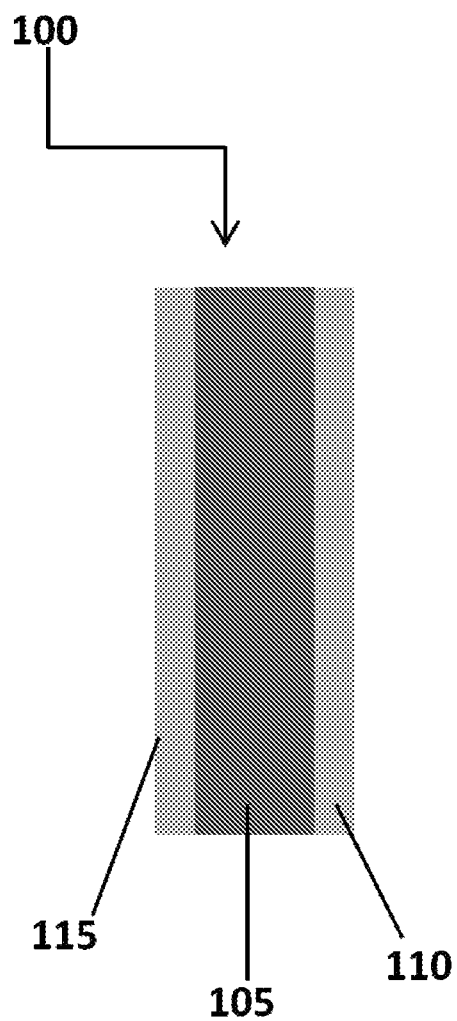
FIG. 1 schematically depicts an exemplary glass sealing sheet.

Reference will now be made in detail to embodiments of glass sealing sheets, methods for manufacturing glass sealing sheets, glass packages, and methods for manufacturing glass packages, examples of which are illustrated in the accompanying drawings. In embodiments herein, glass sealing sheets for sealing OLEDs and glass packages comprising glass sealing sheets and OLEDs are set forth in significant detail. It is noted, however, that this is merely an illustrative implementation of the embodiments disclosed herein. The embodiments are applicable to other technologies that are susceptible to similar problems as those discussed above. For example, embodiments for sealing electronic and photonic devices and structures are clearly within the purview of the present embodiments. These may include, but are not limited to, integrated circuits and semiconductor structures. Moreover, the example embodiments are applicable in other types of optical devices besides OLED displays including field emission displays, plasma displays, inorganic electroluminescent (EL) displays, and other optical devices where sensitive films have to be protected from the environment. Whenever possible, the same reference numerals will be used throughout the drawings to refer to the same or like parts.

The term "substantially free," when used to describe the absence of a particular component in a glass composition, means that the component is present in the glass composition as a contaminant in a trace amount of less than 0.1 mol. %.

In embodiments herein, glass sealing sheets are disclosed comprising a glass core layer having a first side and a second side, and a first cladding layer fused to the first side of the glass core layer. Additionally, or alternatively, the glass sealing sheets comprise a second cladding layer fused to the second side of the glass core layer. In embodiments herein, methods of manufacturing glass sealing sheets comprise melting a core glass composition to form a molten core glass composition, melting a first cladding glass composition comprising radiation absorbing constituents to form a molten first cladding glass composition, flowing the molten core glass composition and the molten first cladding glass composition such that they converge and form a composite flow, and drawing the composite flow into a glass sealing sheet. Additionally, or alternatively, the methods of manufacturing glass sealing sheets comprise melting a second cladding composition to form a molten second cladding composition, flowing the molten core glass composition, the molten first cladding glass composition, and the molten second cladding composition such that they converge and form a composite flow, and drawing the composite flow into a glass sealing sheet.

In embodiments herein, a glass package is disclosed comprising a glass sealing sheet, and a glass substrate sealed to the glass sealing sheet such that a hermetic seal is substantially created. In embodiments herein, methods of manufacturing a glass package comprise placing a glass sealing sheet in contact with a glass substrate, and irradiating a predetermined sealing area along the glass sealing sheet with a laser to form a substantially hermetically sealed glass package.

Referring to FIG. 1, depicted is a schematic view of an exemplary embodiment of a glass sealing sheet 100 comprising a glass core layer 105 having a first side and a second side, a first cladding layer 110 bonded or fused to the first side of the glass core layer 105, and a second cladding layer 115 bonded or fused to the second side of the glass core layer 105. The interfaces between the first cladding layer 110 and the glass core layer 105 and/or between the second cladding layer 115 and the glass core layer 105 can be free of any bonding material such as, for example, an adhesive, a coating layer, or any non-glass material added or configured to adhere the respective cladding layers to the glass core layer. Thus, the first cladding layer 110 and/or the second cladding layer 115 are fused directly to the glass core layer 105 or are directly adjacent to the glass core layer 105. In some embodiments, the glass sealing sheet comprises one or more intermediate layers disposed between the glass core layer and the first cladding layer and/or between the glass core layer and the second cladding layer. For example, the intermediate layers comprise intermediate glass layers and/or diffusions layers formed at the interface of the glass core layer and the cladding layer (e.g., by diffusion of one or more components of the glass core and cladding layers into the diffusion layer). In some embodiments, the glass sealing sheet 100 comprises a glass-glass laminate (e.g., an in situ fused multilayer glass-glass laminate) in which the interfaces between directly adjacent glass layers are glass-glass interfaces.

The glass core layer 105 described herein may be formed from or comprises a glass composition that includes, for example, soda-lime glass, silicate glass, borosilicate glass, aluminosilicate glass, aluminoborosilicate glass, alkaline-earth aluminoborosilicate glass, or other suitable laminate formable glasses. In some embodiments, the glass core layer 105 may be an alkaline-earth aluminoborosilicate glass. The glass core layer 105 is substantially free of radiation absorbing constituents, and is selected such that it is non-absorbing of radiation at an emission wavelength of a laser, for example, or over emission wavelength ranges of lasers used to effect the sealing by heating of the glass sealing sheet 100. In some embodiments, the glass core layer 105 is at least partially transparent.

The dimensions of the glass core layer 105 described herein can be any dimensions suitable for the glass sealing sheet 100 to produce a sealed package. In some embodiments, the glass core layer 105 has a thickness ranging from about 100 microns to about 900 microns. In other embodiments, the glass core layer 105 has a thickness ranging from about 200 microns to about 700 microns. In other embodiments, the glass core layer 105 has a thickness ranging from about 250 microns to about 500 microns.

The glass core layer 105 described herein may have a core coefficient of thermal expansion ("CTE") of from about $0 \times 10^{-7}/°$ C. to about $100 \times 10^{-7}/°$ C. In some embodiments, the glass core layer 105 may have a core CTE of from about $25 \times 10^{-7}/°$ C. to about $80 \times 10^{-7}/°$ C. In further embodiments, the glass core layer 105 may have a core CTE of from about $50 \times 10^{-7}/°$ C. to about $80 \times 10^{-7}/°$ C.

The first cladding layer 110 described herein may be formed from or comprising, for example, a glass composition or polymer composition comprising radiation absorbing constituents. Thus, the first cladding layer 110 may be absorbing of radiation at an emission wavelength or over at least a portion of an emission wavelength range. In some embodiments, the first cladding layer 110 is formed from a glass composition comprising radiation absorbing constituents. The first cladding layer 110 has a first coefficient of thermal expansion. In some embodiments, the first cladding layer 110 is substantially transparent.

The second cladding layer 115 described herein may be formed from or comprising, for example, a glass composition or polymer composition comprising radiation absorbing constituents. Thus, the second cladding layer 115 may be absorbing of radiation at an emission wavelength or over at least a portion of an emission wavelength range. Alternatively, the second cladding layer 115 described herein may be formed from, for example, a glass composition or polymer composition that is substantially free of radiation absorbing constituents. Thus, the second cladding layer 115 may be non-absorbing of radiation at an emission wavelength or over at least a portion of an emission wavelength range. The second cladding layer 115 has a second coefficient of thermal expansion. In some embodiments, the second cladding layer 115 is formed from a glass composition. In some embodiments, the second cladding layer 115 is substantially transparent.

The differential between the first CTE and the second CTE may range from about $0 \times 10^{-7}/°$ C. to about $10 \times 10^{-7}/°$ C., in some embodiments, or from about $0 \times 10^{-7}/°$ C. to about $5 \times 10^{-7}/°$ C., in other embodiments. In some embodiments, the first cladding layer 110 and the second cladding layer 115 are formed from different compositions and have a CTE differential ranging from about $0 \times 10^{-7}/°$ C. to about $10 \times 10^{-7}/°$ C. Low or no CTE differentials between the cladding layers can prevent warpage due to the asymmetry of the compressive forces that may occur in glasses with mismatched coefficients of thermal expansion.

The core CTE of the glass core layer 105 may range from about $0 \times 10^{-7}/°$ C. to about $50 \times 10^{-7}/°$ C. greater than the first CTE and/or the second CTE. In some embodiments, the core CTE of the glass core layer 105 may range from about $25 \times 10^{-7}/°$ C. to about $50 \times 10^{-7}/°$ C. greater than the first CTE and the second CTE. A differential between the core CTE and the first and second CTE can result in the first cladding layer 110 and the second cladding layer 115 being compressively stressed without being ion exchanged or thermally tempered, thus imparting damage-resistance to the glass sealing sheet 100. The glass sealing sheet 100 may have a compressive stress greater than about 20 MPa. For example, the glass sealing sheet 100 may have a compressive stress ranging from about 25 MPa to about 400 MPa in some embodiments, from about 25 MPa to about 250 MPa in other embodiments, and from about 75 Mpa to about 200 Mpa in other embodiments. There also may be little to no differential between the core CTE of the glass core layer 105 and the first CTE and the second CTE. In some embodiments the differential between the core CTE of the glass core layer 105 and the first CTE and the second CTE may range from about $0 \times 10^{-7}/°$ C. to about $10 \times 10^{-7}/°$ C.

Suitable glass compositions that may be used to form the first cladding layer 110 and/or second cladding layer 115 may include, but are not limited to, silicate glass, borosilicate glass, aluminosilicate glass, aluminoborosilicate glass, alkaline-earth aluminoborosilicate glass, phosphate glass, or other suitable laminate formable glasses. In some embodiments, the first cladding layer 110 may be an aluminoborosilicate glass. In other embodiments, the first cladding layer 110 and the second cladding layer 115 may both be aluminoborosilicate glasses.

Polymeric compositions may be used where lower processing temperatures are employed in forming the glass sealing sheet 100, and where low birefringence is desired. Suitable polymer compositions that may be used to form the first cladding layer 110 and/or second cladding layer 115 may include, but are not limited to, damage-resistant polymers, for example, acrylates, polycarbonates, styrenes, or other suitable polymers that provide damage resistance.

The first cladding layer 110 and/or second cladding layer 115 may be doped with one or more radiation absorbing constituents using known doping techniques. Examples of suitable radiation absorbing constituents that may be used in the first cladding layer 110 and/or second cladding layer 115 may include, but are not limited to, a transition metal or rare earth element. Example transition metals may include iron, lead, copper, zinc, vanadium, manganese, cobalt, nickel, chromium, and/or molybdenum. Example rare earth elements may include, for example, neodymium and/or cerium. In some embodiments, the radiation absorbing constituent comprises at least one transition metal or rare earth element selected from the group consisting of iron, copper, vanadium, manganese, cobalt, nickel, chromium, neodymium, cerium, molybdenum, and combinations thereof. In other embodiments, the radiation absorbing constituents comprise cerium. It is emphasized that these radiation absorbing constituents are merely exemplary and that other radiation absorbing constituents are contemplated for providing hermetic sealing. As mentioned, the source of the radiation may be a laser. For purposes of illustration, cerium-containing glasses can have a strong absorption at 355 nm and may successfully seal using a pulsed 355 nm laser.

The radiation absorbing constituents are selected such that at a certain wavelength or over a certain wavelength range, melting of the first cladding layer 110 occurs. To this end, it is useful to choose radiation absorbing constituents that absorb at least approximately 30 percent of the energy of the radiation at the wavelength or over emission wavelength ranges of the radiation. In some embodiments, the radiation absorbing constituents absorb at least approximately 65 percent of the energy of the radiation at a wavelength or over emission wavelength ranges of the radiation. In addition, it is noted that absorption of less than approximately 25 percent of the radiation energy is insufficient to adequately affect the sealing, and may degrade other components such as conductive materials used for electrodes on the sheet to be sealed. Further, electromagnetic radiation of various wavelengths or wavelength bands may be used. These may include, but are not limited to microwave radiation, millimeter radiation and ultra-violet radiation, and/or infrared radiation.

The amount of radiation absorbing constituents present in the composition of the first cladding layer 110 and/or second cladding layer 115 may vary, and should be present in an amount sufficient to absorb enough radiation to effectively melt and provide hermetic glass-to-glass sealing. In some embodiments, the radiation absorbing constituents are present in the composition from about 0.1 mol. % to about 10 mol. %, from about 0.25 mol. % to about 7.5 mol. %, or from about 0.50 mol. % to about 5 mol. %.

In some embodiments, the glass composition of the first cladding layer 110 and/or second cladding layer 115 may comprise:

from about 50 mol. % to about 75 mol. % $SiO_2$;
from about 1 mol. % to about 20 mol. % $Al_2O_3$;
from about 8 mol. % to about 30 mol. % $B_2O_3$;
from about 0 mol. % to about 6 mol. % $Na_2O$;
from about 0 mol. % to about 2 mol. % $Li_2O$;
from about 0 mol. % to about 3 mol. % $K_2O$;
from about 0.5 mol. % to about 5 mol. % radiation absorbing constituents; and
from about 0 mol. % to about 5 mol. % $TiO_2$.

While exemplary glass compositions have been described hereinabove with reference to specific compositional ranges for various constituent components (such as $SiO_2$, $Al_2O_3$, and the like), it should be understood that each compositional range of each constituent component may include one or more narrower compositional ranges for that constituent component in order to produce a glass having the desired properties.

The first cladding layer 110 and the second cladding layer 115 may be the same or different in composition. In some embodiments, the first cladding layer 110 and the second cladding layer 115 are formed from different compositions and have a CTE differential ranging from about $0 \times 10^{-7}$/° C. to about $10 \times 10^{-7}$/° C. For example, in some embodiments, the first cladding layer 110 may comprise a first glass composition comprising radiation absorbing constituents, and the second cladding layer 115 may comprise a second glass composition substantially free of radiation absorbing constituents. In other embodiments, the first cladding layer 110 may comprise a first glass composition comprising radiation absorbing constituents, and the second cladding layer 115 may comprise a polymer composition without radiation absorbing constituents. In further embodiments, the first cladding layer 110 may comprise a first glass composition comprising radiation absorbing constituents, and the second cladding layer 115 may comprise a second glass composition comprising radiation absorbing constituents. In even further embodiments, the first cladding layer 110 may comprise a first glass composition comprising radiation absorbing constituents, and the second cladding layer 115 may comprise a polymer composition with radiation absorbing constituents. In even further embodiments, the first cladding layer 110 may comprise a first glass composition comprising radiation absorbing constituents, and the second cladding layer 115 may comprise the first glass composition substantially free of radiation absorbing constituents. It should be apparent to those of ordinary skill in the art that other combinations of first and second cladding layers may be used herein. For example, the first cladding layer 110 and the second cladding layer 115 may both comprise a polymer composition comprising radiation absorbing constituents, and some instances, the second cladding layer 115 may be substantially free of radiation absorbing constituents.

The dimensions of the first cladding layer 110 described herein can be any dimension suitable for the glass sealing sheet 100 being fabricated. In some embodiments, the first cladding layer 110 has a thickness ranging from about 20 microns to about 200 microns. In other embodiments, the first cladding layer 110 has a thickness ranging from about 30 microns to about 150 microns. Similarly, the second cladding layer 115 described herein can be any dimension suitable for the glass sealing sheet 100 being fabricated. In some embodiments, the second cladding layer 115 has a thickness ranging from about 20 microns to about 200 microns. In other embodiments, the second cladding layer 115 has a thickness ranging from about 30 microns to about 150 microns. The total thickness of the glass sealing sheet 100 may be less than about 1 mm.

The glass sealing sheet 100 may be formed by, for example, a fusion process. In some embodiments, glass sealing sheets 100 described herein may be form by a fusion lamination process such as the process described in U.S. Pat. No. 4,214,886, which is incorporated herein by reference. The glass sealing sheet 100 may also be formed by, for example, a slot draw lamination process.

In an exemplary method of manufacturing glass sealing sheets, a core glass composition is melted in a core melting vessel to form a molten core glass composition, a first cladding glass composition comprising radiation absorbing constituents is melted in a first melting vessel to form a molten first cladding glass composition, and a second cladding glass composition is melted in a second melting vessel to form a molten second cladding glass composition. The molten glass compositions are delivered to a forming apparatus where the molten core glass composition, the molten first cladding glass composition, and the molten second cladding glass composition flow such that they converge and form a composite flow. The molten glass streams fuse into a single glass composite flow. The glass composite flow is drawn into a glass sealing sheet having a final desired thickness.

Figure 2:
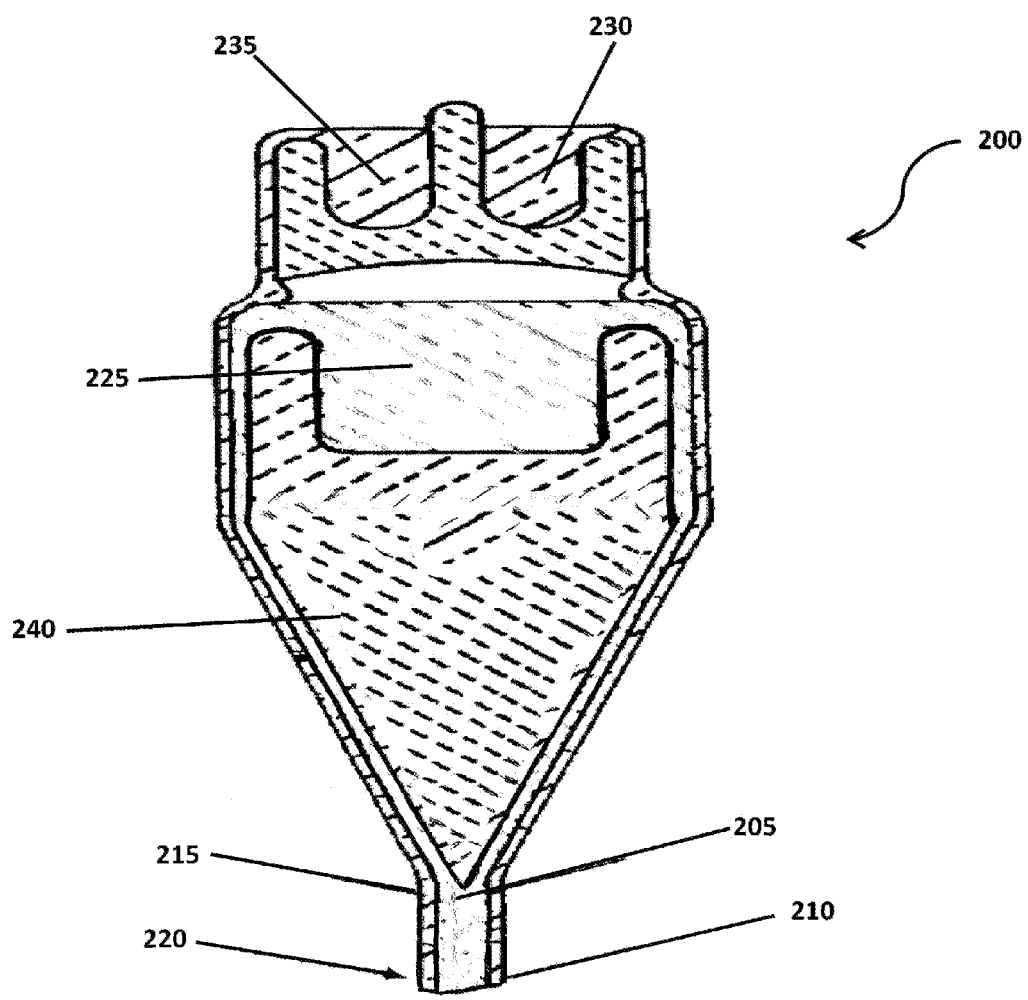
FIG. 2 schematically depicts an exemplary method of manufacturing a glass sealing sheet.

Referring to FIG. 2, an example of a fusion lamination process 200 is depicted. The core glass composition, which forms the glass core layer 205, the first cladding glass composition, which forms the first cladding layer 210, and the second cladding glass composition, which forms the second cladding layer 215, are separately melted and delivered through an appropriate delivery system to a corresponding overflow distributor 225, 230, 235, respectively. The overflow distributors 230, 235 includes a central wall that allows for two different glass compositions to be used in forming the first cladding layer 210 and second cladding layer 215. The overflow distributors 230, 235 are mounted above the overflow distributor 225 so that the glass from the overflow distributors 230, 235 flows over top edge portions of the overflow distributors 230, 235 and down the sides to form a uniform flow layer of appropriate thickness on both sides of the overflow distributors 230, 235 below such top edge portions. Asymmetric layer thicknesses are achievable by adjusting the relative glass flow over the two sides of any given overflow distributor (and associated forming member) such as by tilting the forming member, or a combination thereof.

The overflow distributor 225 has a wedge-shaped forming member 240 associated therewith. The forming member 240 has converging sidewall portions which communicate at their top end with the sidewalls of the overflow distributor 225 and terminate at their converging bottom ends in a draw line. The molten core glass overflowing the overflow distributor 225 flows downwardly along the distributor walls and forms an initial glass flow layer adjacent to the converging outer surfaces of the forming member 240, whereas the molten first and second cladding glass overflowing the overflow distributors 230, 235 from above flows downwardly over the distributor walls and flows over outer surface portions of the glass core layer 205, thereby fusing together and creating a glass composite flow 220. The two individual layers of core glass from each converging sidewall of the forming member 240 are brought together and fused to form the glass core layer 205, which is located between the first cladding layer 210 and second cladding layer 215. The dimensional control and resulting pristine glass surface conditions can make the fusion, or overflow process, a satisfactory method for making glass sealing sheets.

In another exemplary method of manufacturing glass sealing sheets, a core glass composition is melted in a core melting vessel to form a molten core glass composition, a first cladding glass composition comprising radiation absorbing constituents is melted in a first melting vessel to form a molten first cladding glass composition, and a second cladding polymer composition is melted in a second melting vessel to form a molten second cladding polymer composition. The molten glass compositions are delivered to a forming apparatus where the molten core glass composition and the molten first cladding glass composition flow such that they converge to form a single glass composite flow, and the glass composite flow and the molten second cladding polymer composition flow such that they converge and form a composite flow. The molten glass streams fuse into a single glass composite flow. The composite flow is drawn into a glass sealing sheet having a final desired thickness.

Figure 3:
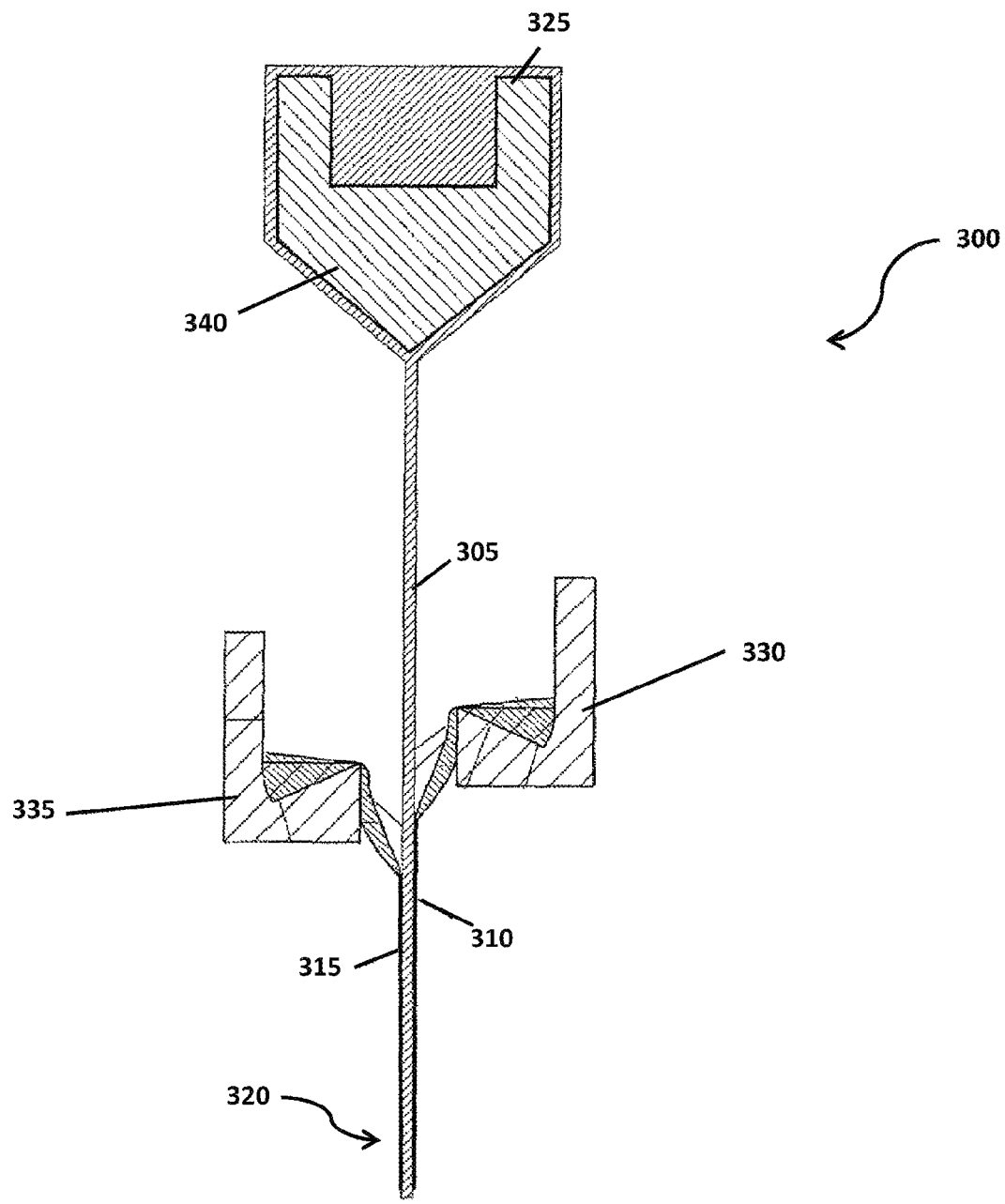
FIG. 3 schematically depicts an exemplary method of manufacturing a glass sealing sheet.

Referring to FIG. 3, an example of a fusion lamination process 300 is depicted. The core glass composition, which forms the glass core layer 305, the first cladding glass composition, which forms the first cladding layer 310, and the second cladding polymer composition, which forms the second cladding layer 315, are separately melted and delivered through an appropriate delivery system to a corresponding overflow distributors 325, 330, 335, respectively. Single-sided overflow distributors 330, 335 allows for two different compositions to be used in forming the first cladding layer 310 and second cladding layer 315. While the exemplary fusion lamination process discloses the use of a glass and polymer composition to form the first and second cladding layers, respectively, it should be understood that the process may also be used where two different glass compositions are used, for example.

The single-sided overflow distributors 330, 335 are positioned at different heights below the overflow distributor 325. The compositions from the overflow distributors 330, 335 flow over a top edge portion of the overflow distributors 330, 335 and down the sides to form a uniform flow layer of appropriate thickness that will converge with the glass core layer 305 flow. The first cladding glass composition coats a first side of the glass core layer 305 to form a first cladding layer 310, and the second cladding polymer composition coats a second side of the glass core layer 305 to form a second cladding layer 315. Asymmetric layer thicknesses are achievable by adjusting the relative composition flow over the side of any given overflow distributor.

The double-sided overflow distributor 325 has a wedge-shaped forming member 340 associated therewith. The forming member 340 has converging sidewall portions which communicate at their top end with the sidewalls of the overflow distributor 325 and terminate at their converging bottom ends in a draw line. The molten core glass overflowing the overflow distributor 325 flows downwardly along the distributor walls and forms an initial glass flow layer adjacent to the converging outer surfaces of the forming member 340. The two individual layers of core glass from each converging sidewall of the forming member 340 are brought together and fused to form the glass core layer 305, which is located between the first cladding layer 310 and second cladding layer 315. The molten first cladding composition overflows the overflow distributor 330 and flows downwardly over the distributor walls and over a first outer surface portion of the glass core layer 305, thereby fusing together and creating a glass composite flow. The molten second cladding composition overflows the overflow distributor 335 and flows downwardly over the distributor walls and over a second outer surface portion of the glass core layer 305 to form a composite flow 320 that includes the first cladding layer 310, the second cladding layer 315 and the glass core layer 305. The dimensional control and resulting pristine glass surface conditions can make the fusion, or overflow process, a satisfactory method for making glass sealing sheets. For all the coating methods described above, the sheet-like flow of the glass core layer 305 is very reactive when in flowable or molten form, allowing the first cladding layer 310 and the second cladding layer 315 to form a strong bond with the surfaces of the glass core layer 305.

Glass sealing sheets may be cut from the glass composite and transported for further processing. The glass sealing sheets comprise a glass core layer having a first side and a second side, a first cladding layer bonded to the first side of the glass core layer, and a second cladding layer bonded to the second side of the glass core layer.

Figure 4:
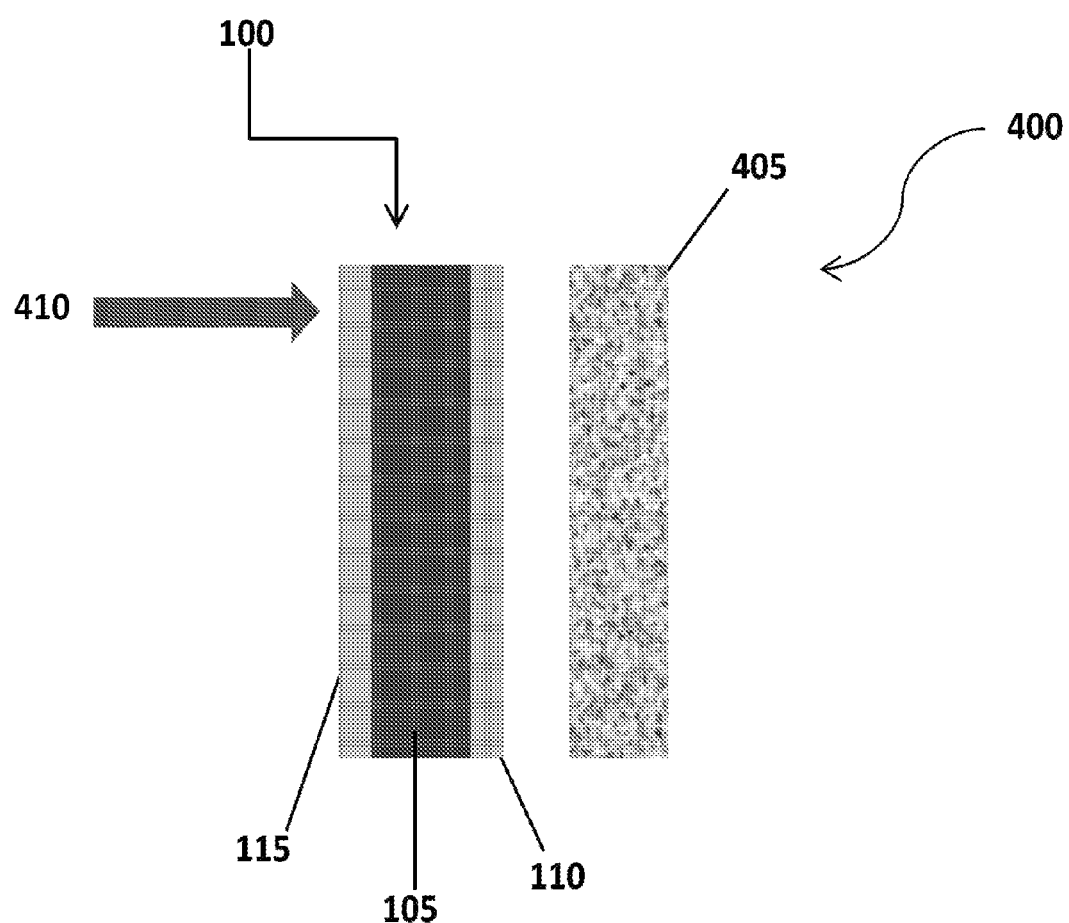
FIG. 4 schematically depicts an exemplary method of manufacturing a glass package.

Referring to FIG. 4, depicted is a method 400 of manufacturing a glass package comprising placing the first cladding layer 110 of the glass sealing sheet 100 in contact with a glass substrate 405. A laser 410 is used to irradiate a predetermined sealing area along the first cladding layer 110 of glass sealing sheet 100 to melt the first cladding layer 110. The first cladding layer 110 forms a hermetically sealed glass package with the glass substrate 405 along the sealing area thereby binding the glass sealing sheet 100 to the glass substrate 405. The glass package comprises a glass sealing sheet 100 and a glass substrate 405 sealed to the glass sealing sheet 100 such that a hermetic seal is substantially created.

In some embodiments, the glass substrate 405 may be at least partially transparent. However, this is not essential. The material of the glass substrate 405 is application driven. For example, the glass substrate 405 may comprise a borosilicate glass material. In some embodiments, the glass substrate 405 may be a transparent glass plate. Glass plates similar to those manufactured and sold by Corning Incorporated, such as Code 2916 glass or Eagle XG™ glass can be used. Other glass plates manufactured and sold by companies such as Asahi Glass Co. (e.g., OA10 and OA21 glass), Schott AG, Nippon Electric Glass Co., NHTechno and Samsung Corning Precision Glass Co. may also be used.

It may be beneficial for the material selected for the glass substrate 405 to be substantially non-absorbing of radiation at an emission wavelength of a laser or over emission wavelength ranges of lasers used to effect the sealing by heating of the glass sealing sheet 100. In some embodiments, the glass substrate 405 may be substantially free of radiation absorbing constituents. In other embodiments, the glass substrate 405 may comprise radiation absorbing constituents having a wavelength or wavelength range that is essentially transparent to electromagnetic radiation emitted from a laser source used to seal the glass sealing sheet to a glass substrate.

The glass substrate 405 may have OLEDs and/or other circuitry deposited thereon. Of course, the methods and products of the exemplary embodiments disclosed herein may be used in other applications than those described. For example, the methods and products of the exemplary embodiments may be used in microreactor applications, where channels between plates of substantially inert material (s) (e.g., glass) can be used to introduce chemicals that form a reaction product(s). Furthermore, the methods and products of the illustrative embodiments may be used to provide sealing of a wide variety of thin film devices that require hermeticity, such as semiconductor thin-film devices.

In embodiments described herein, a laser 410 provides the electromagnetic radiation. However, this is not essential. The wavelength or wavelength range of the electromagnetic radiation used to effectuate sealing is chosen so as to not be substantially absorbed by (and thus significantly heat) the glass core layer 105 of the sealing sheet or the glass substrate 405; especially if there is temperature sensitive material disposed on the glass substrate 405.

The glass sealing sheet 100 is irradiated in a manner to heat a portion of the first cladding layer 110 along a predetermined sealing area. The laser 410 emits a laser beam through the second cladding layer 115 and the glass core layer 105 so that it is focused on the predetermined sealing area of the first cladding layer 110. The sealing area melts as it is heated to form a hermetic seal that connects and bonds to the glass substrate 405 along the sealing area. The sealing area may be located along the edges of the glass substrate 405. Other sealing area configurations may be used in order to maximize the sealed area of the device. For example, the sealing area may not have the same shape as the shape of the glass substrate 405.

The glass sealing sheets described herein can be used for a variety of applications including, for example, for cover glass or glass backplane applications in consumer or commercial electronic devices including, for example, LCD, LED, OLED, and quantum dot displays, computer monitors, sound bars, and automated teller machines (ATMs); for touch screen or touch sensor applications, for portable electronic devices including, for example, mobile telephones, personal media players, and tablet computers; for integrated circuit applications including, for example, semiconductor wafers; for photovoltaic applications; for architectural glass applications; for automotive or vehicular glass applications including, for example, windows, lighting, instruments, and helmet visors; for commercial or household appliance applications; for lighting or signage (e.g., static or dynamic signage) applications; for transportation applications including, for example, rail and aerospace applications; or for antimicrobial applications.

A variety of products can incorporate the glass sealing sheets described herein. In some embodiments, an electronic device (e.g., a consumer or commercial electronic device) such as, for example, a LCD, LED, OLED, or quantum dot display comprises one or more of the glass sealing sheets, which can be deployed as a cover glass, or as a glass backplane. In some embodiments, an integrated circuit such as, for example, a semiconductor wafer, comprises one or more of the glass sealing sheets. In some embodiments, a lighting device (e.g., a LED or OLED) comprises one or more of the glass sealing sheets. In some embodiments, a photovoltaic cell comprises one or more of the glass sealing sheets. In some embodiments, an architectural pane comprises one or more of the glass sealing sheets. In some embodiments, a vehicular member or component such as, for example, a glazing or window, a light, or an instrument comprises one or more of the glass sealing sheets. In some embodiments, a helmet visor comprises one or more of the glass sealing sheets. In some embodiments, an appliance (e.g., a household or commercial appliance) comprises one or more of the glass sealing sheets. In some embodiments, a light or a sign comprises one or more of the glass sealing sheets.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed is:

1. A glass sealing sheet comprising:
   a glass core layer having a first side and a second side;
   a first cladding layer bonded to the first side of the glass core layer; and
   a second cladding layer bonded to the second side of the glass core layer;
   wherein:
   the first cladding layer has a first coefficient of thermal expansion and comprises a glass composition that is absorbing of radiation over at least a portion of an emission wavelength range;
   the second cladding layer has a second coefficient of thermal expansion and comprises a glass composition that is different from the glass composition of the first cladding layer; and
   a differential between the first coefficient of thermal expansion and the second coefficient of thermal expansion ranges from about $0 \times 10^{-7}/°$ C. to about $10 \times 10^{-7}/°$ C.

2. The glass sealing sheet of claim 1, wherein the glass composition of the first cladding layer comprises at least one radiation absorbing constituent selected from the group consisting of iron, copper, vanadium, manganese, cobalt, nickel, chromium, neodymium, cerium, molybdenum, and combinations thereof.

3. The glass sealing sheet of claim 1, wherein the glass composition of the first cladding layer comprises:

from about 50 mol. % to about 75 mol. % $SiO_2$;
from about 1 mol. % to about 20 mol. % $Al_2O_3$;
from about 8 mol. % to about 30 mol. % $B_2O_3$;
from about 0 mol. % to about 6 mol. % $Na_2O$;
from about 0 mol. % to about 2 mol. % $Li_2O$;
from about 0 mol. % to about 3 mol. % $K_2O$;
from about 0.5 mol. % to about 5 mol. % radiation absorbing constituents; and
from about 0 mol. % to about 5 mol. % $TiO_2$.

4. The glass sealing sheet of claim 1, wherein the glass core layer has a core coefficient of thermal expansion that is from about $0 \times 10^{-7}/°$ C. to about $50 \times 10^{-7}/°$ C. greater than the first coefficient of thermal expansion or the second coefficient of thermal expansion.

5. The glass sealing sheet of claim 1, wherein the first cladding layer and the second cladding layer have a thickness of from about 30 microns to about 150 microns.

6. The glass sealing sheet of claim 1, wherein the glass composition of the second cladding layer is absorbing of radiation over the at least a portion of an emission wavelength range.

7. The glass sealing sheet of claim 1, wherein the glass sealing sheet has a total thickness of less than about 1 mm.

8. The glass sealing sheet of claim 1, wherein the first cladding layer and the second cladding layer have a compressive stress of from about 20 MPa to about 400 MPa.

9. A glass package comprising:
the glass sealing sheet of claim 1; and
a glass substrate sealed to the glass sealing sheet.

10. The glass package of claim 9, wherein the glass substrate is hermetically sealed to the glass sealing sheet.

11. A method of manufacturing a glass sealing sheet, the method comprising:
melting a core glass composition to form a molten core glass composition;
melting a first cladding glass composition to form a molten first cladding glass composition, the first cladding glass composition being absorbing of radiation over at least a portion of an emission wavelength range;
melting a second cladding glass composition to form a molten second cladding glass composition that is different from the first cladding glass composition;
flowing the molten core glass composition, the molten first cladding glass composition, and the molten second cladding glass composition such that they converge and form a composite flow; and
drawing the composite flow into a glass sealing sheet comprising:
a glass core layer comprising the core glass composition and having a first side and a second side;
a first cladding layer comprising the first cladding glass composition and a first coefficient of thermal expansion and bonded to the first side of the glass core layer; and
a second cladding layer comprising the second cladding glass composition and a second coefficient of thermal expansion and bonded to the second side of the glass core layer;
wherein a differential between the first coefficient of thermal expansion and the second coefficient of thermal expansion ranges from about $0 \times 10^{-7}/°$ C. to about $10 \times 10^{-7}/°$ C.

12. The method of claim 11, wherein the first cladding glass composition comprises at least one radiation absorbing constituent selected from the group consisting of iron, copper, vanadium, manganese, cobalt, nickel, chromium, neodymium, cerium, molybdenum, and combinations thereof.

13. The method of claim 11, wherein the first cladding glass composition comprises:
from about 50 mol. % to about 75 mol. % $SiO_2$;
from about 1 mol. % to about 20 mol. % $Al_2O_3$;
from about 8 mol. % to about 30 mol. % $B_2O_3$;
from about 0 mol. % to about 6 mol. % $Na_2O$;
from about 0 mol. % to about 2 mol. % $Li_2O$;
from about 0 mol. % to about 3 mol. % $K_2O$;
from about 0.5 mol. % to about 5 mol. % radiation absorbing constituents; and
from about 0 mol. % to about 5 mol. % $TiO_2$.

14. The method of claim 11, wherein the glass core layer has a core coefficient of thermal expansion that is from about $0 \times 10^{-7}/°$ C. to about $50 \times 10^{-7}/°$ C. greater than the first coefficient of thermal expansion or the second coefficient of thermal expansion.

15. The method of claim 11, wherein the second cladding glass composition is absorbing of radiation over the at least a portion of an emission wavelength range.

16. A method of manufacturing a glass package, the method comprising:
placing a glass sealing sheet in contact with a glass substrate, the glass sealing sheet comprising:
a glass core layer having a first side and a second side;
a first cladding layer bonded to the first side of the glass core layer; and
a second cladding layer bonded to the second side of the glass core layer;
wherein:
the first cladding layer has a first coefficient of thermal expansion and comprises a glass composition that is absorbing of radiation over at least a portion of an emission wavelength range;
the second cladding layer has a second coefficient of thermal expansion and comprises a glass composition that is different from the glass composition of the first cladding layer; and
a differential between the first coefficient of thermal expansion and the second coefficient of thermal expansion ranges from about $0 \times 10^{-7}/°$ C. to about $10 \times 10^{-7}/°$ C.; and
irradiating a predetermined sealing area along the first cladding layer with a laser to form a sealed glass package.

17. The method of claim 16, wherein the glass composition of the first cladding layer comprises at least one radiation absorbing constituent selected from the group consisting of iron, copper, vanadium, manganese, cobalt, nickel, chromium, neodymium, cerium, and combinations thereof.

18. The method of claim 16, wherein radiation from the laser is directed through each of the second cladding layer and the glass core layer and focused on the predetermined sealing area along the first cladding layer.

19. An electronic device, an architectural glass pane, an automotive glazing or vehicular glass member, an appliance, or a lighting device comprising a cover glass comprising the glass sealing sheet of claim 1.

20. The glass sealing sheet of claim 1, wherein the glass composition of the second cladding layer is substantially free of radiation absorbing constituents.

21. The glass sealing sheet of claim 1, wherein the second cladding layer is non-absorbing of radiation over the at least a portion of an emission wavelength range.

22. The glass sealing sheet of claim 1, wherein the first cladding layer absorbs at least about 30% of radiation at a wavelength in the emission wavelength range.

23. The glass sealing sheet of claim 22, wherein the emission wavelength range comprises at least one of microwave radiation, millimeter radiation, ultraviolet radiation, or infrared radiation.

* * * * *

UNITED STATES PATENT AND TRADEMARK OFFICE
CERTIFICATE OF CORRECTION

PATENT NO. : 9,902,138 B2
APPLICATION NO. : 14/897983
DATED : February 27, 2018
INVENTOR(S) : Victoria Ann Edwards It is certified that error appears in the above-identified patent and that said Letters Patent is hereby corrected as shown below:

On the Title Page

Column 2, item (56), Other Publications, Line 2, delete "Non-Cystalline" and insert
-- Non-Crystalline --, therefor.

Signed and Sealed this
Twelfth Day of May, 2020

Andrei Iancu
*Director of the United States Patent and Trademark Office*